United States Patent [19]
Goto et al.

[11] Patent Number: 4,788,161
[45] Date of Patent: Nov. 29, 1988

[54] METHOD OF PRODUCING AN END SURFACE LIGHT EMISSION TYPE SEMICONDUCTOR DEVICE

[75] Inventors: Katsuhiko Goto; Shogo Takahashi; Etsuji Omura, all of Itami, Japan

[73] Assignee: Mitsubishi Denki Kabushiki Kaisha, Japan

[21] Appl. No.: 130,547

[22] Filed: Dec. 9, 1987

[30] Foreign Application Priority Data

Feb. 4, 1987 [JP] Japan ................................. 62-23940

[51] Int. Cl.$^4$ ......................................... H01L 21/306
[52] U.S. Cl. ................................... 437/228; 437/226; 437/906; 437/229
[58] Field of Search ............. 437/228, 229, 225, 126, 437/127, 133, 130, 129, 905, 906, ; 148/DIG. 99, DIG. 137; 156/652, 656, 659.1

[56] References Cited

U.S. PATENT DOCUMENTS

| 3,820,237 | 6/1974 | Effer | 437/905 |
| 3,964,157 | 6/1976 | Kuhn et al. | 437/906 |
| 3,981,023 | 9/1976 | King et al. | 437/905 |
| 4,339,689 | 7/1982 | Yamanaka et al. | 437/906 |
| 4,501,637 | 2/1985 | Mitchell et al. | 437/905 |
| 4,740,259 | 4/1988 | Heinen | 437/905 |

FOREIGN PATENT DOCUMENTS

| 0080988 | 7/1978 | Japan | 437/906 |
| 0050587 | 5/1981 | Japan | 437/905 |
| 0107874 | 6/1985 | Japan . | |

OTHER PUBLICATIONS

"Reliable High Power Edge Emitting LEDs for 1.3 μm 140 Mb/s Multi-Mode Communication Systems", IOOC '83, 29B2-4.

Primary Examiner—Brian E. Hearn
Assistant Examiner—Kevin McAndrews
Attorney, Agent, or Firm—Leydig, Voit & Mayer

[57] ABSTRACT

A method of producing an end surface light emmision type semiconductor device comprising: a process of producing a lower cladding layer, an active layer, and an upper cladding layer on a semiconductor substrate; a process of forming a stripe groove of a predetermined depth reaching the lower cladding layer at a predetermined position of the wafer to produce an output end surface; a process of depositing photosensitive material in the groove; a process of producing a required number of lenses from the photosensitive material; and a process of dividing the wafer into a plurality of lens-appended end surface light emission type semiconductor devices.

1 Claim, 2 Drawing Sheets (a)

(b)

(c)

(d)

(e)

METHOD OF PRODUCING AN END SURFACE LIGHT EMISSION TYPE SEMICONDUCTOR DEVICE

FIELD OF THE INVENTION

The present invention relates to a method of producing an end surface light emission type semiconductor device in which the output power is enhanced.

BACKGROUND ART

FIG. 3 is a perspective view showing a prior art end surface light emission type LED. In FIG. 3, the reference numeral 1 designates an n type substrate, the numeral 2 designates an n type cladding layer as a lower cladding layer, the numeral 3 designates an active layer, the numeral 4 designates a p type cladding layer as an upper cladding layer, the numeral 5 designates an insulating film, the numeral 6 designates a p side electrode, and the numeral 7 designates an n side electrode.

When a forward direction voltage bias is applied to the end surface light emission type LED of FIG. 3, a current flows in the central portion of the element which is concentrated where the insulating film 5 is removed in a stripe configuration, and it is converted into a light in the active layer 3. The light generated in the active layer 3 is confined by the n type cladding layer 2 and the p type cladding layer 4, and is transmitted within the active layer 3 and emerges from the end surface as a light output.

In the prior art end surface light emission type LED of such a construction, there is no mechanism for confining the light in the direction parallel with the junction surface, and therefore the broadening of the output light in the horizontal direction is especially large. Even in a case where a light confinement structure is provided in the transverse direction, the end surface light emission type LED has low directionality, and the broadening of the light is large. Therefore, it is only possible to couple a portion of the output light of the LED input to an optical fiber having a small core radius, thereby resulting in a low fiber coupling coefficient.

Conventionally, there is a method in which a spherical lens is attached to the light output end surface in order to improve such a low coupling efficiency. In such a method, however, it is difficult to attach a spherical lens to the light emission region precisely because of the small sized light emission region, and to do so in mass production since a spherical lens has to be attached to each element.

SUMMARY OF THE INVENTION

An object of the present invention is to provide an improved method of producing an end surface light emission type semiconductor device which has an improved fiber coupling efficiency and is superior in the mass producibility.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, an output end surface is produced by forming a stripe groove in a wafer, and depositing photosensitive material in the groove that is processed by photolithography so as to produce a required number of lenses. Thus, lenses of quite high precision can be produced, and further the light output from the end surface that broadens in the horizontal direction can be collected.

DETAILED DESCRIPTION OF THE PREFERRED EMBODIMENTS

Figure 1:
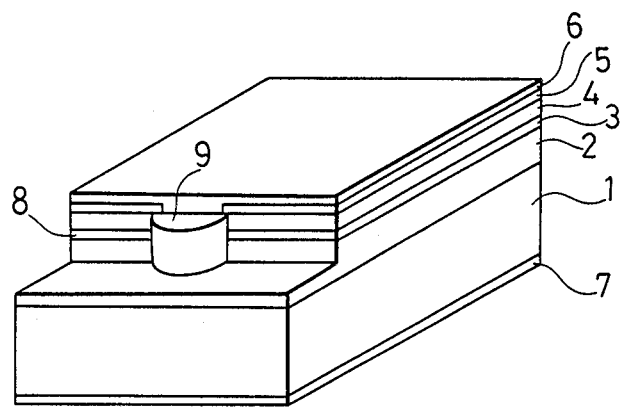
FIG. 1 is a perspective view showing an end surface light emission type LED produced by a method as an embodiment of the present invention.

In order to explain the present invention in detail, reference will be particularly made to FIG. 1.

Figure 3:
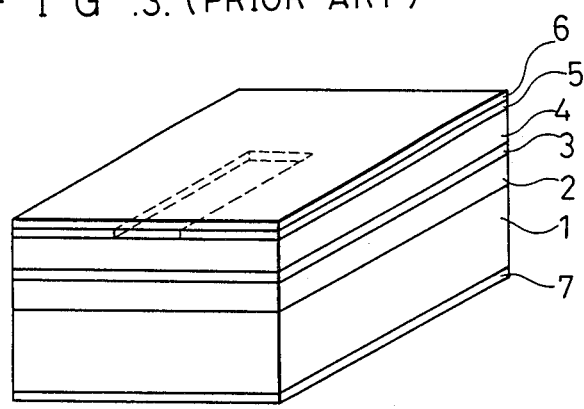
FIG. 3 is a perspective view showing a prior art end surface light emission type LED.

In FIG. 1, the reference numerals 1 to 7 designate the same elements as those shown in FIG. 3. The reference numeral 8 designates an output end surface produced by forming a stripe groove of a predetermined depth reaching the lower cladding layer at a predetermined position of a wafer. Herein the wafer is produced by producing a lower cladding layer 2, an active layer 3, and an upper cladding layer 4 on a semiconductor substrate 1. The reference numeral 9 designates a lens comprising photosensitive material produced at the light emission region at the central portion of the end surface 8.

Next, an embodiment of the method of producing the end surface light emission type LED of FIG. 1 will be described with reference to FIGS. 2(a) to (b).

Figure 2:
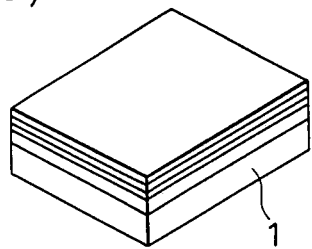
FIGS. 2(a) to (e) are perspective views exemplifying the process of producing the LED of FIG. 1.
Figure 2:
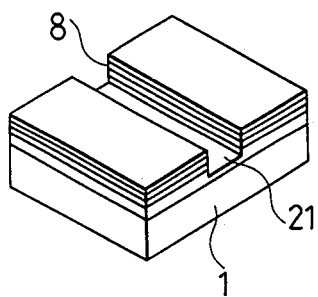
Figure 2:
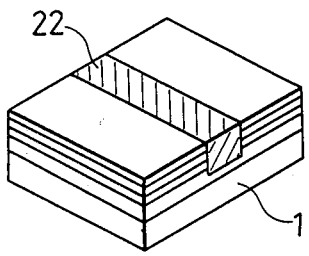
Figure 2:
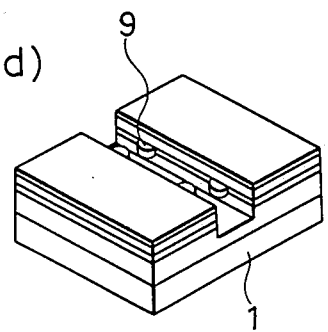
Figure 2:
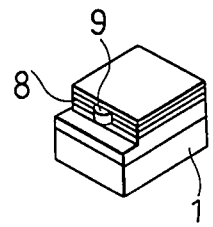

At first, as shown in FIG. 2(a), an n type cladding layer as a lower cladding layer 2, an active layer 3, and a p type cladding layer 4 as an upper cladding layer 4 are successively grown on the n type substrate 1. Next, as shown in FIG. 2(b), a stripe groove 21 which reaches the n type cladding layer 2 is formed by photolithography and etching thereby to produce an end surface 8. Next, after photosensitive material such as photosensitive high molecular weight material 22 is deposited in the groove 21 as shown in FIG. 2(c), an insulating film 5, a p side electrode 6, and an n side electrode 7 are produced at portions other than the groove 21 as shown in FIG. 1. Next, as shown in FIG. 2(d), the remainder of the photosensitive high molecular material 22 deposited in the groove 21 other than the lens shaped portions in contact with the end surface 8 is removed thereby to produce lenses 9 in predetermined patterns comprising photosensitive high molecular material 22 at the end surface 8. Next, the wafer is divided at required positions, thereby resulting in a plurality of end surface light emission type LEDs shown in FIG. 2(e).

In the end surface light emission type LED of FIG. 1, a lens 9 comprising photosensitive high molecular material 22 is provided at the end surface 8 of the light emission region, and therefore the output light that broadens in the horizontal direction is collected. Furthermore, it is possible to reduce the loss due to the refraction and reflection at the end surface 8 by lowering the refractive index difference at the end surface 8. As a result, the proportion of the light which is input to the optical fiber to the output light is increased, thereby obtaining a large in-fiber light output.

Furthermore, in a case where the lens 9 is attached to the end surface 8, it is preferred that the diameter of the lens 9 be smaller than the core radius of the fiber. In the present invention it is possible to produce a lens of small diameter because the lens 9 is produced by photolithography.

Furthermore, the position of the lens 9 is precisely determined by photolithography, and therefore it is possible to reduce the extent to which the light output is lowered due to the deviation of the light from the lens 9. Furthermore, the present invention is superior in the mass producibility because the lenses 9 are produced by photolithography in the wafer.

In the above-illustrated embodiment, a stripe electrode type end surface light emission type LED is described, but the present invention can be also applied to an end surface light emission type LED or semiconductor laser of other structure.

As is evident from the foregoing description, according to the present invention, an output end surface is produced by forming a stripe groove in a wafer, and depositing a photosensitive material in the groove that is processed by a photolithography so as to produce a required number of lenses. Thus, lenses of quite precision can be produced, and further the output light which is from the end surface and broadens in the horizontal direction can be collected. Accordingly, an end surface light emission type semiconductor device having a high fiber coupling coefficient and thus capable of obtaining a large in-fiber light output can be produced easily and precisely.

What is claimed is:

1. A method of producing an end surface light emission type semiconductor device comprising:
   producing a lower cladding layer, an active layer, and an upper cladding layer on a semiconductor substrate;
   forming a stripe groove of a predetermined depth reaching said lower cladding layer at a predetermined position of the wafer thereby to produce an output end surface;
   depositing photosensitive material in said groove;
   producing a required number of lenses from said photosensitive material; and
   dividing said wafer into a plurality of lens-appended end surface light emission type semiconductor devices.

* * * * *